US012610505B2

(12) United States Patent
Clerc et al.

(10) Patent No.: US 12,610,505 B2
(45) Date of Patent: Apr. 21, 2026

(54) STRUCTURE AND METHOD FOR FLUID IMMERSION COOLING

(71) Applicant: CGG Services SAS, Massy (FR)

(72) Inventors: Laurent Clerc, Houston, TX (US); Jean-Yves Blanc, Massy (FR); Emilie Lelogeais, Massy (FR)

(73) Assignee: CGG Services SAS, Massy (FR)

( * ) Notice: Subject to any disclaimer, the term of this patent is extended or adjusted under 35 U.S.C. 154(b) by 194 days.

(21) Appl. No.: 18/531,209

(22) Filed: Dec. 6, 2023

(65) Prior Publication Data

US 2025/0194056 A1    Jun. 12, 2025

(51) Int. Cl.
H05K 7/20 (2006.01)

(52) U.S. Cl.
CPC ..... H05K 7/20772 (2013.01); H05K 7/20272 (2013.01)

(58) Field of Classification Search
CPC ........... H05K 7/20254; H05K 7/20272; H05K 7/20772; H05K 7/20327; H05K 7/20345; H05K 7/20781; H05K 7/20809; H05K 7/20854; H05K 7/20927; H05K 7/20936; H05K 7/20981; H05K 7/2099; H05K 7/20509
See application file for complete search history.

(56) References Cited

U.S. PATENT DOCUMENTS

| | | |
|---|---|---|
| 10,257,963 B2 | 4/2019 | Ozyalcin et al. |
| 10,349,555 B2 | 7/2019 | Barragy et al. |
| 10,568,234 B1 * | 2/2020 | Mao .................... H05K 7/20781 |
| 10,791,647 B1 | 9/2020 | Miyamura et al. |
| 2014/0029193 A1 * | 1/2014 | Alshinnawi ........ H05K 7/20772 |
| | | 361/679.49 |
| 2016/0381840 A1 | 12/2016 | Peterson et al. |
| 2017/0311479 A1 | 10/2017 | Barragy et al. |
| 2018/0343770 A1 | 11/2018 | Brink |
| 2019/0219311 A1 | 7/2019 | Smith |

(Continued)

FOREIGN PATENT DOCUMENTS

| | | |
|---|---|---|
| CN | 212 341 825 U | 1/2021 |
| CN | 213694613 U | 7/2021 |

(Continued)

OTHER PUBLICATIONS

Office Action issued in corresponding Japanese Application No. 2022-079514 ; dated Jan. 21, 2025 (5 pages).

(Continued)

*Primary Examiner* — Jacob R Crum
(74) *Attorney, Agent, or Firm* — Osha Bergman Watanabe & Burton LLP

(57) ABSTRACT

A support for directing a fluid flow of a dielectric oil through a server includes an upper deck, a central channel, a cooling channel, a lip, and a channel orifice. The upper deck extends in a longitudinal plane and provides an abutment surface for a connection face of the server. The central channel is formed as a first opening of the upper deck that contains the server. The cooling channel is formed as a second opening of the upper deck, and houses a conduit and a radiator of a heat exchanger. The lip protrudes from the upper deck, and directs the fluid flow of the dielectric oil from the central channel into the cooling channel. Further, the channel orifice fluidly connects the cooling channel to the central channel, and the dielectric oil is transferred from the cooling channel into the central channel through the channel orifice.

19 Claims, 9 Drawing Sheets

(56)               References Cited

U.S. PATENT DOCUMENTS

| | | | |
|---|---|---|---|
| 2019/0344495 A1 | 11/2019 | Shuck | |
| 2019/0383559 A1 | 12/2019 | Aoki et al. | |
| 2020/0288600 A1 | 9/2020 | Gao | |
| 2022/0248564 A1* | 8/2022 | Moon | H05K 7/20236 |
| 2022/0322572 A1* | 10/2022 | Chehade | H05K 7/20809 |
| 2022/0369504 A1 | 11/2022 | Clerc et al. | |

FOREIGN PATENT DOCUMENTS

| | | |
|---|---|---|
| CN | 214 592 559 U | 11/2021 |
| CN | 216 017 518 U | 3/2022 |
| TW | 201947350 A | 12/2019 |

OTHER PUBLICATIONS

International Search Report issued in corresponding International Application No. PCT/US2024/058884; mailed Jan. 30, 2025 (5 pages).

Written Opinion of the International Searching Authority issued in corresponding International Application No. PCT/US2024/058884; dated Jan. 30, 2025 (8 pages).

Office Action Issued in Corresponding EP Application No. 22 305 653.2 , dated Aug. 18, 2023. (7 pages).

Office Action issued in corresponding Japanese Patent Application No. 2022-079514, dated Jun. 24, 2025 (3 pages).

Office Action Issued in corresponding TW application No. 111118164, dated May 2, 2025 (5 Pages).

Intellectual Property Office of Singapore Search Report issued in Corresponding Application No. 10202205011T, dated Jan. 21, 2026. (2 pages).

Intellectual Property Office of Singapore Written Opinion issued in Corresponding Application No. 10202205011T, dated Jan. 22, 2026. (7 pages).

* cited by examiner

Temp: 220°
TTC: 2.6 Hours

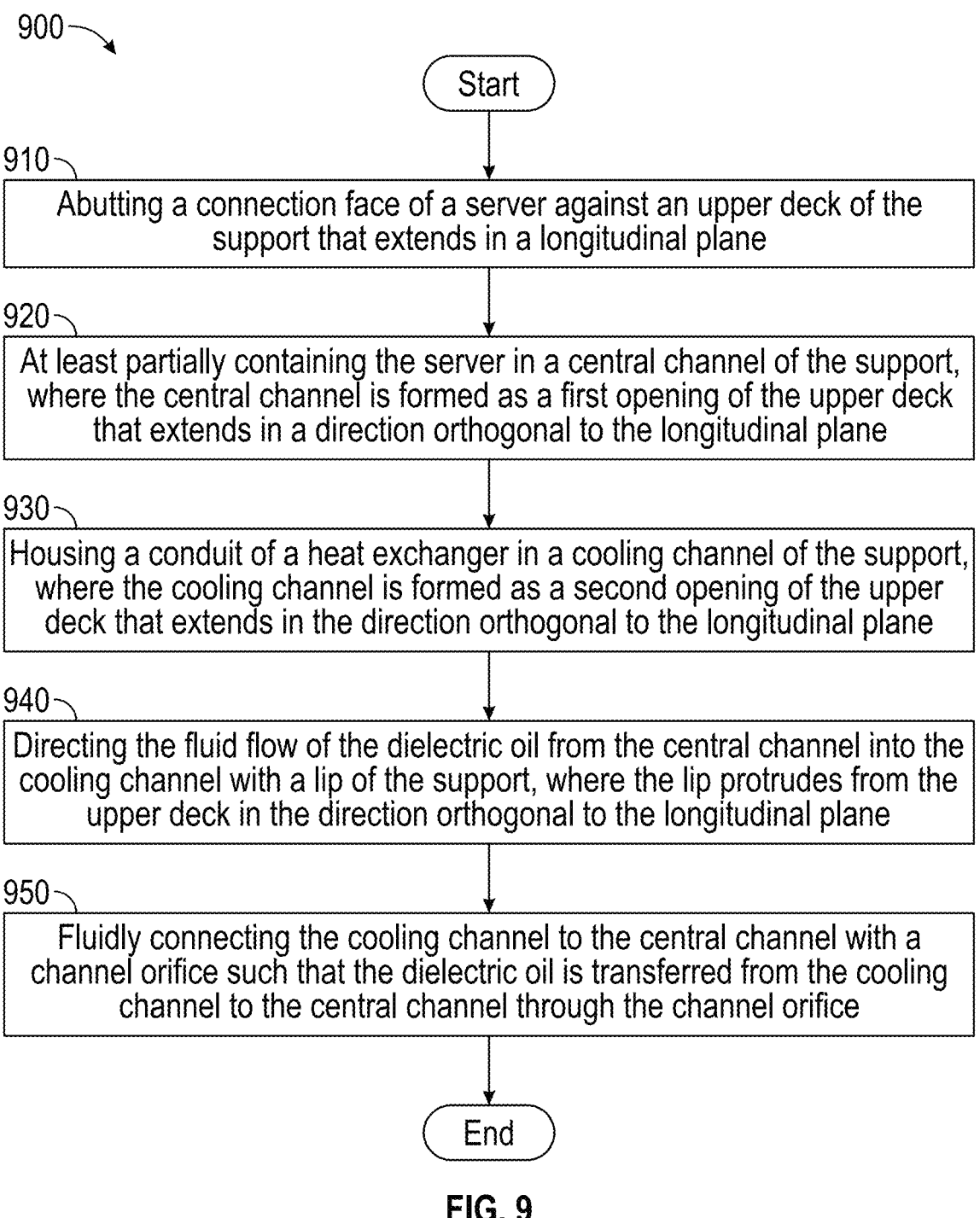

900

Start

910
Abutting a connection face of a server against an upper deck of the support that extends in a longitudinal plane 920
At least partially containing the server in a central channel of the support, where the central channel is formed as a first opening of the upper deck that extends in a direction orthogonal to the longitudinal plane 930
Housing a conduit of a heat exchanger in a cooling channel of the support, where the cooling channel is formed as a second opening of the upper deck that extends in the direction orthogonal to the longitudinal plane 940
Directing the fluid flow of the dielectric oil from the central channel into the cooling channel with a lip of the support, where the lip protrudes from the upper deck in the direction orthogonal to the longitudinal plane 950
Fluidly connecting the cooling channel to the central channel with a channel orifice such that the dielectric oil is transferred from the cooling channel to the central channel through the channel orifice End

STRUCTURE AND METHOD FOR FLUID IMMERSION COOLING

BACKGROUND

Due to the ubiquitous nature of computing devices, it is becoming increasingly common to house the computing devices in a primary storage location of a facility. This primary storage location may be referred to as a "data center," and typically includes storage structures such as large racks or shelving units that serve to stack the computing devices in a vertical orientation. In this way, the storage structures create a clean and tidy environment necessary for a human operator to not trip or injure themselves on exposed computing devices.

However, it is commonly known that computing devices necessarily emit heat during their usage. Furthermore, data centers typically rely on convective air currents, which may be produced by the motion of overhead fans and/or Air Conditioning (AC) units of the facility, to remove heat from a component of the computing device. In addition, the stacked nature of the computing devices in the storage structure inhibits the ability of a convective air current to effectively pass through a space between the computing devices, as the overhead fans and/or AC units are not positioned directly facing the space between the stacked computing devices. Moreover, as thermal design power (TDP), or an expected maximum amount of heat generated, increases the convective air currents may provide insufficient cooling. That is, the density of heat produced by a computing device may be too large to be removed by natural convective currents alone, such that forced convection is necessary to cool the computing device.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A support for directing a fluid flow of a dielectric oil through a server includes an upper deck, a central channel, a cooling channel, a lip, and a channel orifice. The upper deck extends in a longitudinal plane and provides an abutment surface for a connection face of the server. The central channel is formed as a first opening of the upper deck that extends in a direction orthogonal to the longitudinal plane, and at least partially contains the server. The cooling channel is formed as a second opening of the upper deck that extends in the direction orthogonal to the longitudinal plane, and houses a conduit and a radiator of a heat exchanger. The lip protrudes from the upper deck in the direction orthogonal to the longitudinal plane, and directs the fluid flow of the dielectric oil from the central channel into the cooling channel. The channel orifice fluidly connects the cooling channel to the central channel such that the dielectric oil is transferred from the cooling channel into the central channel through the channel orifice.

A method for using a support for directing a fluid flow of a dielectric oil through a server includes abutting a connection face of the server against an upper deck of the support that extends in a longitudinal plane. The method further includes at least partially containing the server in a central channel of the support, where the central channel is formed as a first opening of the upper deck that extends in a direction orthogonal to the longitudinal plane. A conduit and a radiator of a heat exchanger are housed in a cooling channel of the support as part of the method, where the cooling channel is formed as a second opening of the upper deck that extends in the direction orthogonal to the longitudinal plane. Subsequently, a lip of the support directs the fluid flow of the dielectric oil from the central channel into the cooling channel, where the lip protrudes from the upper deck in the direction orthogonal to the longitudinal plane. Further, the method includes fluidly connecting the cooling channel to the central channel with a channel orifice such that the dielectric oil is transferred from the cooling channel to the central channel through the channel orifice.

In another embodiment of the invention, a computer readable medium stores instructions, executed by a processor of a 3D printer, that causes the 3D printer to form a support. Specifically, the instructions cause the 3D printer to deposit a filament on a substrate in successive, vertically stacked layers with an extrusion nozzle of the 3D printer to form the support. The support includes an upper deck, a central channel, a cooling channel, a lip, and a channel orifice. The upper deck extends in a longitudinal plane and provides an abutment surface for a connection face of the server. The central channel is formed as a first opening of the upper deck that extends in a direction orthogonal to the longitudinal plane, and at least partially contains the server. The cooling channel is formed as a second opening of the upper deck that extends in the direction orthogonal to the longitudinal plane, and houses a conduit and a radiator of a heat exchanger. The lip protrudes from the upper deck in the direction orthogonal to the longitudinal plane, and directs the fluid flow of the dielectric oil from the central channel into the cooling channel. The channel orifice fluidly connects the cooling channel to the central channel such that the dielectric oil is transferred from the cooling channel into the central channel through the channel orifice.

Any combinations of the various embodiments and implementations disclosed herein can be used in a further embodiment, consistent with the disclosure. Other aspects and advantages of the claimed subject matter will be apparent from the following description and the claims.

BRIEF DESCRIPTION OF DRAWINGS

Specific embodiments of the disclosed technology will now be described in detail with reference to the accompanying figures. Like elements in the various figures are denoted by like reference numerals for consistency. The sizes and relative positions of elements in the drawings are not necessarily drawn to scale. For example, the shapes of various elements and angles are not necessarily drawn to scale, and some of these elements may be arbitrarily enlarged and positioned to improve drawing legibility.

FIG. 9 depicts a flowchart of a process for using a support in accordance with one or more embodiments disclosed herein.

DETAILED DESCRIPTION

Figure 1:
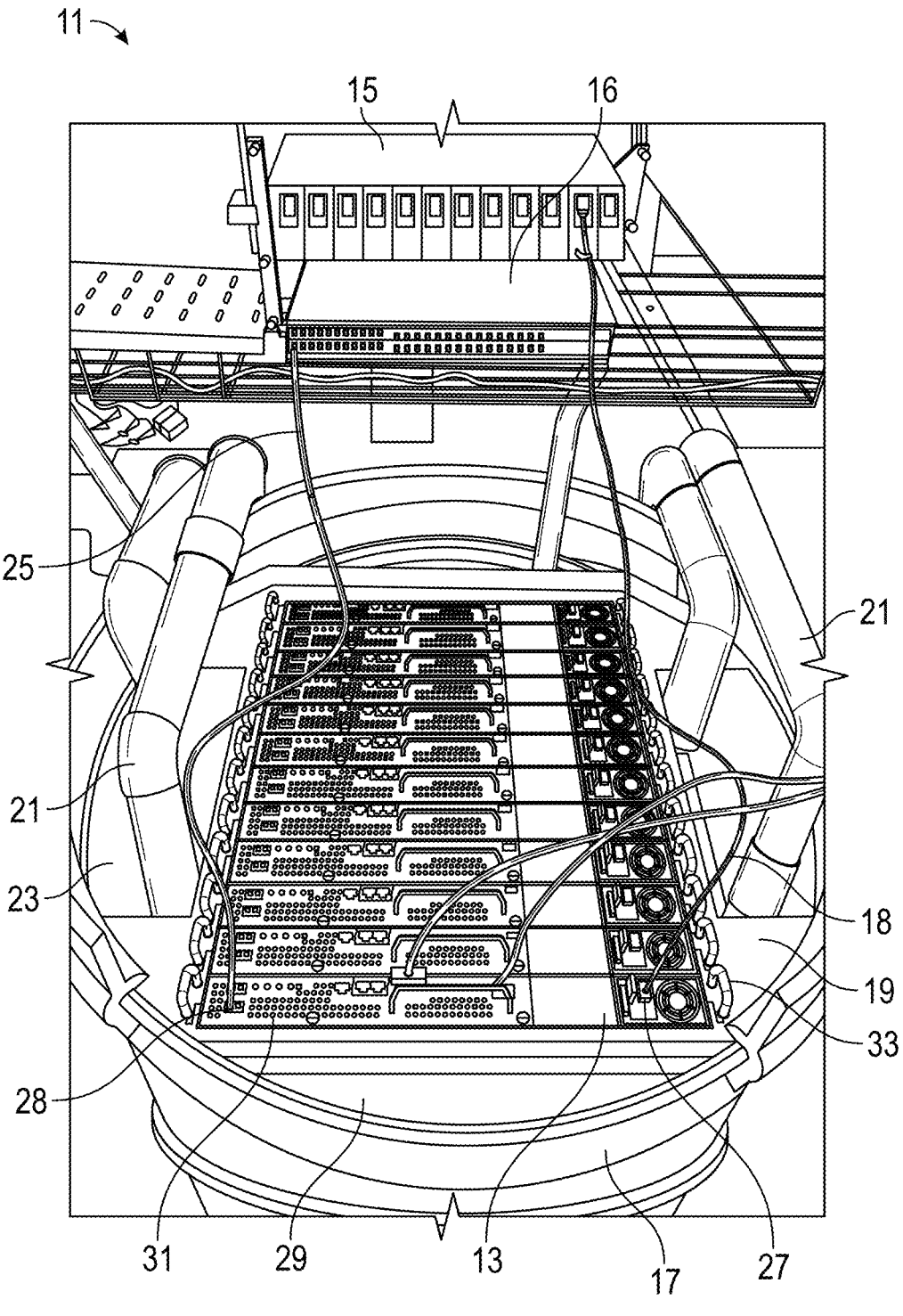
FIG. 1 depicts a system in accordance with one or more embodiments disclosed herein.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not intended to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In addition, throughout the application, the terms "upper" and "lower" may be used to describe the position of an element of the invention. In this respect, the term "upper" denotes an element disposed above a corresponding "lower" element in a vertical direction, while the term "lower" conversely describes an element disposed below a corresponding "upper" element in the vertical direction. Likewise, the term "axial" refers to an orientation substantially parallel to a central axis of a rounded or cylindrical component of the invention, while the term "radial" refers to an orientation orthogonal to the central axis of the component. Similarly, the term "inner" refers to an orientation closer to a center of an object than a corresponding "outer" orientation.

In general, embodiments of the invention are directed towards a support configured to direct a fluid flow of a first cooling fluid, embodied as a dielectric oil or liquid, through a series of servers. The support is formed as a single, three dimensional (3D) printed structure, and is placed in a cylindrical container containing the dielectric oil. The support includes a central channel that directs the dielectric oil vertically through the servers, and a cooling channel that houses a radiator and a conduit containing water. The support further includes an upper deck that the servers abut against and may be fixed to. In addition, the support includes a lip that extends vertically upwards from the upper deck to redirect the dielectric oil from the central channel into the cooling channel. The support may be configured with multiple cooling channels, in which case the lip directs the dielectric oil from the central channel into each of the cooling channels. In this way, the support is configured, as a whole, to control the direction of a flow of a dielectric oil used to cool the server(s).

As shown in FIG. 1, a system 11 includes a server 13 that is powered by a power distribution system 15 and is housed in a support 19 disposed in a cylindrical container 17. The server 13 may be embodied, for example, as a blade server or a rack server. In addition, the power distribution system 15 may be embodied as an Alternate Current (AC)/Direct Current (DC) converter that converts a received AC input power to a DC output power to be used by the server 13. The power distribution system 15 may further format the current of the received AC input power in such a way so as to render a power supply (not shown) of the server 13 redundant, or so that the power supply (not shown) of the 13 may be removed entirely. In this regard, the current formatting comprises AC to DC conversion or voltage conversion. For its part, the power distribution system 15 may be formed with a titanium or platinum transformer, for example, which offer a relatively high power conversion efficiency. Power is transferred from the power distribution system 15 to the server 13 by way of a power cable 18, which is an insulated wire configured to provide an electrical pathway for power output by the power distribution system 15. Additionally, power from the power cable 18 is received by the server 13 by way of a power terminal 27, which is a reception port, fixed to the server 13, that is electrically connected to the remainder of the components of the server 13.

Furthermore, the cylindrical container 17 may be configured with an open top, and may be formed of a metal such as a chrome-molybdenum steel alloy, a vanadium steel alloy, a nickel steel alloy, or an equivalent metal. Alternatively, the cylindrical container 17 may be formed of a plastic polymer such as polyvinyl chloride (PVC), high-density polyethylene (HDPE), nylon, or polystyrene, for example, and may take the form of a cube, rectangular prism, or other polyhedrons without departing from the nature of this disclosure.

Figure 5:
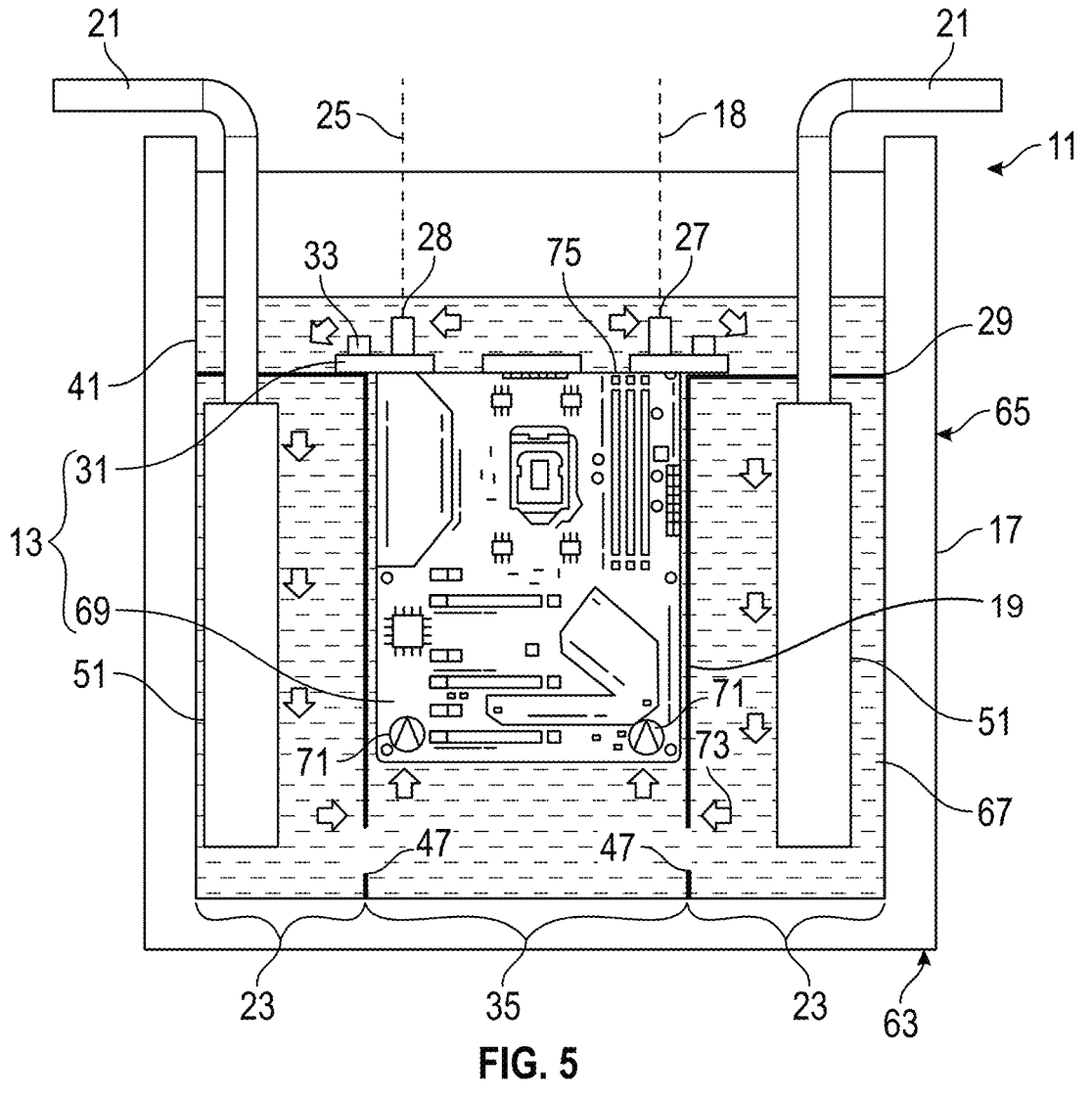
FIG. 5 depicts a support in accordance with one or more embodiments disclosed herein.

For its part, the support 19 serves to provide an internal structure of the cylindrical container 17 that facilitates the positioning and orientation of various other components of the system 11 within the cylindrical container 17. The support 19 includes an upper deck 29 that forms a planar surface extending in a horizontal direction, and the upper deck 29 is parallel to a bottom surface of the cylindrical container 17. When the server 13 is placed in the support 19, a connection face 31 of the server 13 abuts against the upper deck 29 of the support 19, such that the remainder of the server 13 (e.g., a circuit board thereof as depicted in FIG. 5) is suspended and immersed in the dielectric oil. To remove the server 13 from the support 19, each server 13 includes a pair of server handles 33 that are fixed to the connection face 31 of the server 13 such that an operator can grip the server handles 33 and vertically lift the server 13 from the support 19. The server handles 33 may be formed with a rubberized coating to assist an operator in removing the server 13 from the support 19, and are generally formed with an inverted arcuate or semicircular shape to further aid in gripping the server 13.

In general, the server 13 is a computing device or system that provides network or cloud based services to connected devices (not shown) in a network (not shown) that includes the server 13. To this end, the server 13 is connected to a network switch 16 by way of a data cable 25, where the network switch 16 is a hub that interconnects the server 13 to the connected devices to form the network (not shown) of connected devices (not shown). The data cable 25 is a wire that transmits electrical data signals from the server 13 to the network switch 16, and connects to a networking port 28 of the connection face 31 of the server 13. Accordingly, the networking port 28 is a data reception port, fixed to the server 13, that is electrically connected to the remainder of the components of the server 13 to allow data to be transmitted to and from the server 13.

Within the network (not shown), the server 13 provides additional resources or functionality to the connected devices (not shown), such as performing computations, functions, or applications on behalf of or at the behest of the connected devices. Alternatively, or additionally, the server 13 may provide data storage services to a connected device, or to facilitate communication between connected devices. However, the above description of the server 13 is not intended to be all-encompassing, as a server 13 may perform additional functions such as security services or media sharing services. Although not depicted in FIG. 1, the server 13 includes components disposed on a circuit board (e.g., FIG. 5) thereof such as a microprocessor, a processing unit such as a Central Processing Unit (CPU) and/or a Graphics Processing Unit (GPU), one or more storage media (e.g., a Hard Disk Drive (HDD), a Solid State Drive (SDD), or Random Access Memory (RAM)), and a communication device (e.g., ethernet, Wi-Fi, or other Local Area Network (LAN) or Wide Area Network (WAN) interconnects) such as a transceiver that serves to transmit and receive signals from the connected devices.

The server 13 generates a heat load as its components operate to provide the services described above. If a sufficiently large heat load is developed within the server 13, the server 13 may be detrimentally impacted, such as components of the server 13 becoming de-soldered, semi-conductors (not shown) of the server 13 not running at optimal efficiency due to the large heat load, or component burnout. Alternatively, the performance of the server 13 may be throttled or bottlenecked to reduce the heat output of the server, where the heat output would otherwise cause delays or interruptions in the server 13 functionality due to the repair or replacement of components damaged from the heat output. Thus, the cylindrical container 17 contains a dielectric oil (e.g., mineral oil), that the server 13 is immersed in so that the dielectric oil absorbs heat from components of the server 13.

Due to the fact that the dielectric oil is contained in the cylindrical container 17, the dielectric oil itself is only capable of redistributing the heat load from the server 13 to the extremities of the cylindrical container 17. That is, the dielectric oil is not removed from the cylindrical container 17 during the process of cooling the server 13. Thus, to remove heat from the dielectric oil, the system 11 also includes conduits 21 that contain a second cooling liquid such as water. The conduits 21 each include an in-line radiator (e.g., FIG. 3) disposed within the support 19, and are further connected to fluid pipes (e.g., FIG. 4) to form a heat exchanger (e.g., FIG. 4). The fluid pipes (e.g., FIG. 4) include or are coupled to pumps (not shown) that circulate the water through the conduits 21. As shown in FIG. 1, the conduits 21 pass through an opening, referred to herein as a cooling channel 23, of the support 19 such that the conduits 21 are partially immersed in the dielectric oil as well. Thus, when the water is circulated through the conduits 21 in the portion of the conduits 21 immersed in the dielectric oil, the dielectric oil transfers heat through the conduits 21 to the water, which is circulated out of the system 11 with the fluid pipes (e.g., FIG. 4). In this way, heat is removed from the cylindrical container 17 and the components contained therein by the conduits 21, and is transported out of the system 11 by way of fluid pipes (e.g., FIG. 4).

Figure 2:
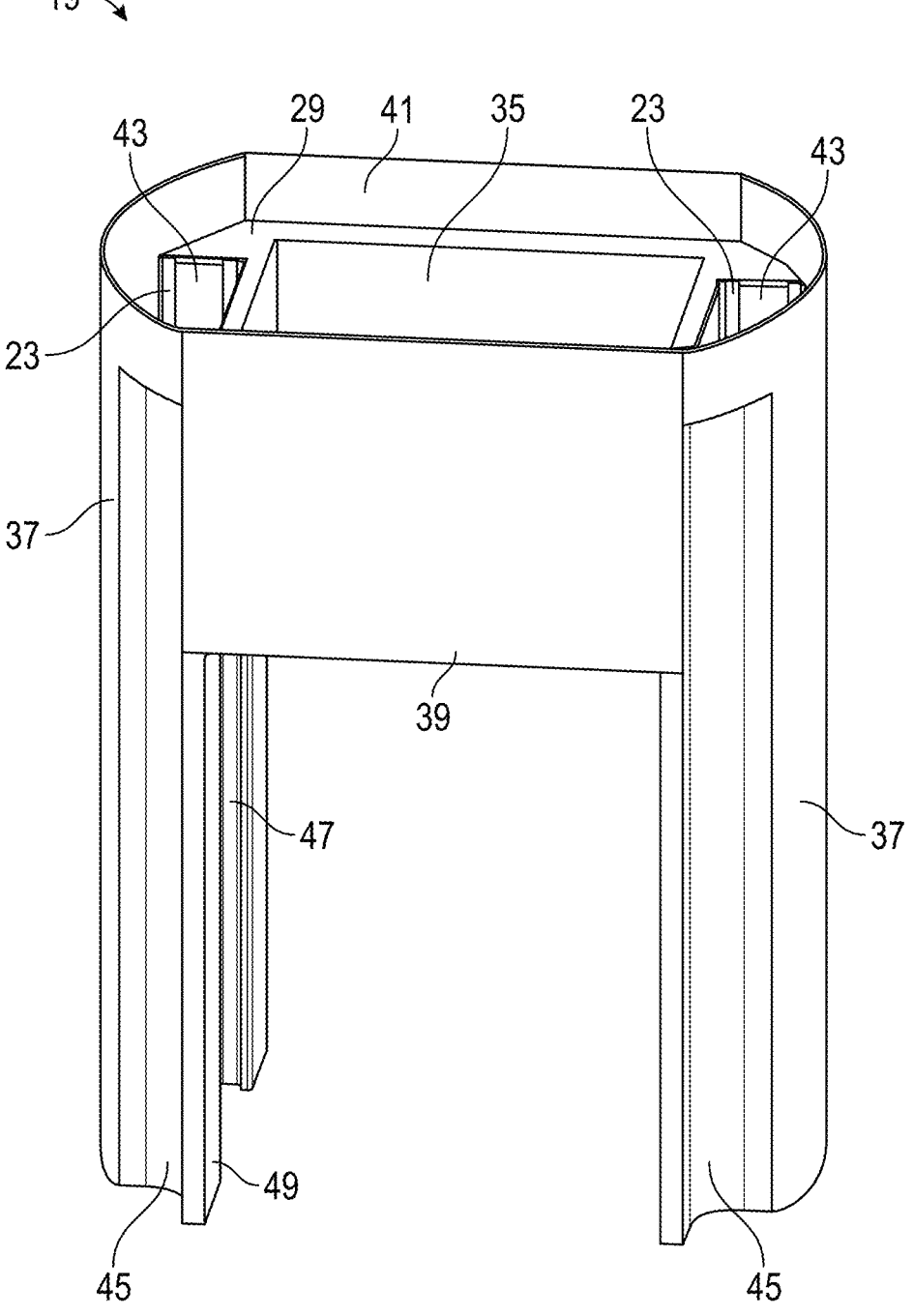
FIG. 2 depicts a support in accordance with one or more embodiments disclosed herein.

Turning to FIG. 2, FIG. 2 depicts a support 19 consistent with one or more embodiments disclosed herein. In general, the support 19 is formed as a 3D printed structure that is manufactured by depositing a filament onto a substrate with a heated extrusion nozzle, which is further discussed in relation to FIG. 7. In an alternative embodiment, the support 19 may be formed as separate components assembled by a manufacturer, or by a variety of modeling processes such as injection molding or casting, for example. Thus, the formation of the support 19 is not limited to 3D printing methods, and may be formed by a variety of manufacturing processes appreciated by a person having ordinary skill in the art. Further examples of methods for forming the support 19 are further discussed in relation to FIG. 7, below.

As one sample embodiment of a support 19, and as depicted in FIG. 2, the support 19 includes an upper deck 29, and a plurality of channels formed as openings of the upper deck 29. More specifically, the plurality of channels include cooling channels 23, which position the conduits 21 within the cylindrical container 17. In addition, the plurality of channels include a central channel 35, which serves to position and suspend a server 13 in the dielectric oil contained by the cylindrical container 17. All of the channels extend in a vertical direction of the support 19, and the cooling channels 23 are separated by the central channel 35 in a horizontal direction of the support 19. That is, the central channel 35 forms a channel in the middle of the upper deck 29 in a horizontal direction, and the cooling channels 23 are formed on the upper deck 29 of the support 19 on either side of the central channel 35.

Furthermore, as depicted in FIG. 2 the support 19 is configured with a substantially cylindrical profile such that the support 19 is sized and shaped to fit within the cylindrical container 17. To this end, horizontal ends 37 of the support 19 that include the cooling channels 23 have the form of a semicylinder, and are connected by a front face 39 and a rear face (not shown) of the support 19. The front face 39 and the rear face (not shown) of the support 19 are formed as flat, vertically oriented planar surfaces, and may be integrally formed with the horizontal ends 37 of the support 19 during the 3D printing process. Thus, the support 19 is configured with a substantially cylindrical form insofar as the semicylinders forming the horizontal ends 37 of the support 19 are each configured with a diameter, rather than a width, and the whole of the support 19 is rounded in nature. The diameter of the semicylinders forming the horizontal ends 37, measured horizontally across the entirety of the support 19, is smaller than a diameter of the cylindrical container 17. On the other hand, a depth between the front face 39 and the rear face (not shown) is closely matched to the dimensions of the servers 13, such that the front face 39 and the rear face serve to contain the servers 13 within the support 19.

The cooling channels 23 formed in the horizontal ends 37 of the support 19 each include a guiding protrusion 43 that maintains a position of a radiator (e.g., FIG. 4) and the conduits 21 within the cooling channels 23. To this end, the guiding protrusion 43 is formed as a trapezoidal prism vertically extending within a corresponding cooling channel 23. The smaller base of the trapezoidal prism is integrally formed with a sidewall of the cooling channel 23, and the larger base of the trapezoidal prism forming the guiding protrusion 43 faces the interior of the corresponding cooling channel 23. The radiator (e.g., FIG. 4) is configured with a complimentary orifice (not shown), shaped in the form of a trapezoidal prism, and the guiding protrusion 43 is inserted into the complimentary orifice to laterally fix the position of the radiator. As the conduits 21 are fixed to radiators (e.g., FIG. 4) as described above, the insertion of the guiding protrusion 43 into the radiator also laterally fixes the position of the conduits 21 within the support 19.

In addition, because the dimensions of the guiding protrusion 43 and the cooling channel 23 closely match the dimensions of the radiator (e.g., FIG. 4), the guiding protrusion 43 and cooling channel 23 further serve to force the dielectric oil through the radiator in a direction normal thereto. In this regard, the phrase "closely match[ing] the dimensions of the radiator," implies that a gap between the guiding protrusion 43 and the complimentary orifice of the radiator is less than 1/16 of an inch (approximately 1.6 mm), for example. Similarly, the cooling channel 23 is also shaped to closely match the dimensions of the radiator in a depth direction (orthogonal to the height direction). Although not shown in FIG. 2, the cooling channel 23 may further be configured with an integrally formed block or supporting plate positioned between the lowermost surface of the radiator and the bottom of the cylindrical container 17. Collectively, the relatively tight dimensions formed between the support 19 and the radiator force the dielectric oil to pass through the radiator, rather than around the radiator, which further increases the cooling effect provided thereby.

To further facilitate the positioning of the radiator (e.g., FIG. 4) within the support 19, the horizontal ends 37 of the support 19 are configured with indentations 45. The indentations 45 are portions of the support 19 that adapt the semicylinder forming the horizontal ends 37 such that the cooling channel 23 itself has flat front and rear faces (with the exception of the guiding protrusion 43) along the vertical height thereof. Thus, the indentations 45 configure the cooling channel 23 with at least two additional substantially flat (i.e., not rounded) surfaces. In conjunction with the flat face that separates a cooling channel 23 from the central channel 35, each cooling channel 23 is configured, overall, with at least three vertically oriented and flat faces, which form the internal volume of the cooling channel 23. The separation of the front and rear flat faces created by the indentations 45, as measured in a depth direction, is larger than the depth of the radiator, measured in the same direction, such that the cooling channel 23 may be sized relative to the radiator as a whole. However, and similar to the above, the separation of the front and rear flat faces created by the indentations is sized to closely match the dimensions of the radiator to force the dielectric oil to pass therethrough.

Regarding a height of the support 19, the height of the support 19 measured in a vertical direction is similarly smaller than or equal to a height of the cylindrical container 17, such that the support 19 does not protrude out of the cylindrical container 17 when disposed therein. Alternatively, a lip 41 of the support 19 that surrounds the periphery of the upper deck 29 may protrude vertically above the opening of the cylindrical container 17, which provides an operator easy access to the upper deck 29 to install the server 13 in the support 19. As the dielectric oil (e.g., FIG. 5) is circulated through the central channel 35, the dielectric oil will flow out of the central channel 35 and onto the upper deck 29 below an upper opening of the cylindrical container 17. When the dielectric oil (e.g., FIG. 5) spills onto the upper deck 29, the lip 41 provides a rim that redirects the dielectric oil into the cooling channels 23, where the dielectric oil is subsequently passed through the radiator and returned to the central channel 35. Regardless of the height of the lip 41, however, the upper deck 29 is positioned below the uppermost surface of the cylindrical container 17 to ensure that the dielectric oil is retained therewithin.

Other than the above, FIG. 2 further depicts that the support 19 is formed with a channel orifice 47. The channel orifice 47 is a rectangularly shaped cutout that extends between the cooling channel 23 and the central channel 35 on the bottom half of the support 19. In this way, the channel orifice 47 allows the dielectric oil (e.g., FIG. 5) to flow from the cooling channel 23 to the central channel 35 after the dielectric oil has passed through the radiator (e.g., FIG. 3).

In conjunction with the upper deck 29 and the guiding protrusion 43, which direct the fluid flow of the dielectric oil on the upper half of the support 19, the channel orifice 47 forms a fluid flow loop that allows the dielectric oil to be circulated through the support 19, the radiator, and the server 13.

In addition, the front face 39 and the rear face (not shown) of the support 19 each include a cutout 49 that reduces the amount of material required to form the support 19. In particular, because the support 19 is a 3D printed structure, the cutout 49 serves as an open portion of the front face 39 and the rear face (not shown) of the support 19 that is not filled with material during the 3D printing process. In this way, the cutout 49 reduces the cost of producing the support 19. The cutout 49 further has a marginal effect on the overall structural integrity of the support 19, as the front face 39 and the rear face (not shown) of the support 19 are still formed with a height and width sufficient to withstand any internal fluid pressure developed by the dielectric oil without structural failure.

Figure 3:
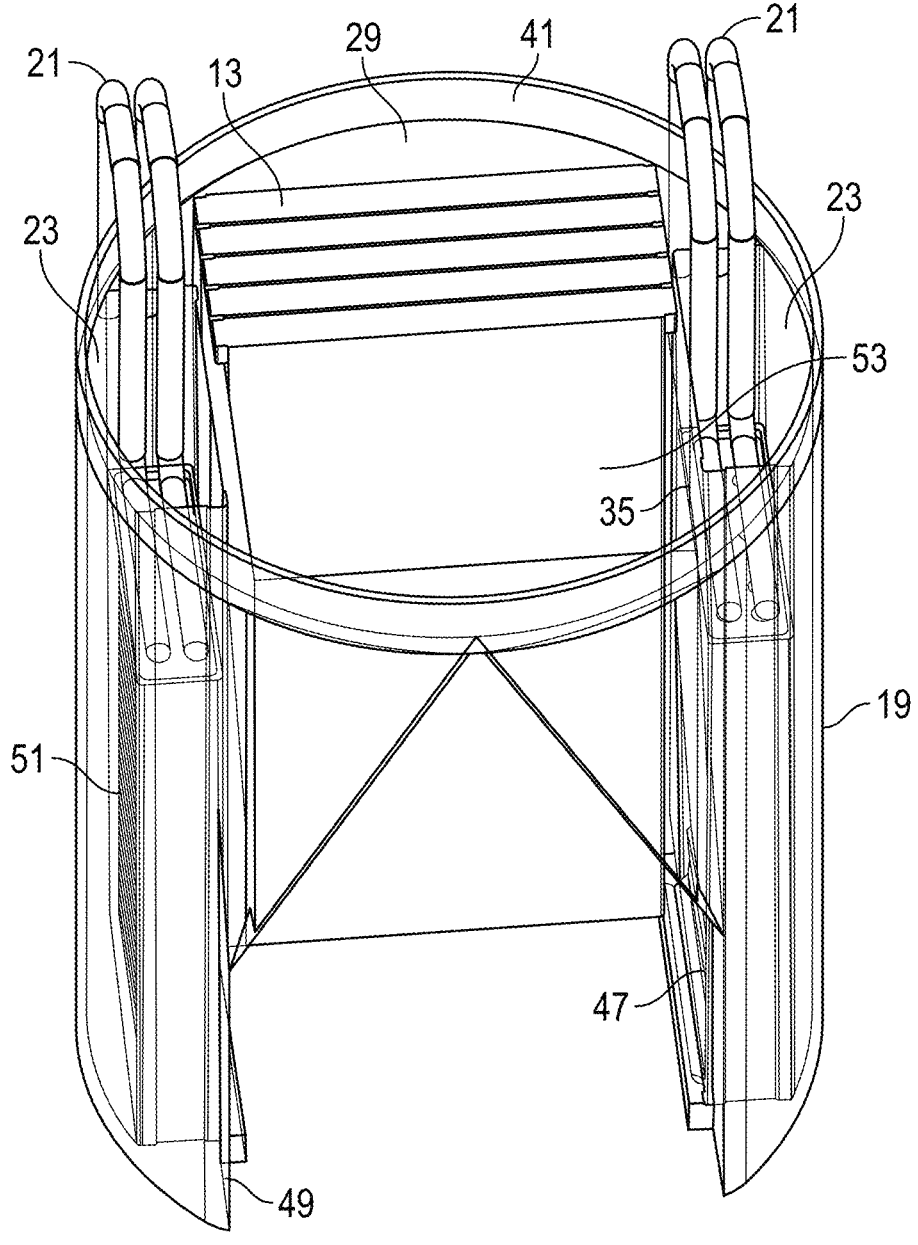
FIG. 3 depicts a support in accordance with one or more embodiments disclosed herein.

Turning to FIG. 3, FIG. 3 depicts a semitransparent view of a support 19 showing its internal components. The embodiment of the support 19 depicted in FIG. 3 differs from the embodiment of the support 19 depicted in FIG. 2 in the sense that the support 19 depicted in FIG. 3 has an entirely cylindrical profile, whereas the support 19 depicted in FIG. 2 has a flat front face 39 and rear face (not shown). While the embodiment of the support 19 depicted in FIG. 2 requires less material to produce due to its flat faces, the support 19 depicted in FIG. 3 is shaped to more closely correspond to the shape of the cylindrical container 17.

Due to the cylindrical shape of the support 19 depicted in FIG. 3, there is little to no dielectric oil surrounding the support 19 itself. That is, in the embodiment depicted in FIG. 3, the support 19 abuts against the cylindrical container 17 itself. The rounded nature of the support 19 depicted in FIG. 3 reduces the number of stress points on the support 19. More specifically, and with respect to the cylindrical container 17 as well as the support 19, a cylindrical form evenly distributes any surface forces away from their location. Thus, the support 19 may be developed with either flat faces (e.g., the front face 39) as depicted in FIG. 2 to reduce the production cost thereof, or an entirely cylindrical profile as depicted in FIG. 3 to provide a more robust immersion cooling system with reduced stress risers. In this way, a particular embodiment of the support 19 may be selected for use based upon a predetermined amount of heat that is contemplated to be produced by the plurality of servers 13, or based upon budget constraints of an immersion cooling system 11 as a whole.

Furthermore, a cross section of the cutout 49 may be formed in different shapes based upon budget and material constraints of the support 19. For example, FIG. 3 depicts that the cutout 49 is formed in the shape of a "house," or more specifically in the shape of a pentagon with two opposing right angles forming the base of the pentagon, two opposing obtuse angles, and a single acute angle. Thus, the cutout 49 depicted in guiding protrusion 43 has an additional "triangular" cutout that is not included in the cutout 49 of FIG. 2. The "triangular cutout" of the cutout 49 thus alleviates some of the material cost of forming a support 19 in a cylindrical shape, and allows the support 19 to be formed without the structural support provided by the flat front face 39 and rear face (not shown) of the support 19 depicted in FIG. 2. Thus, the particular shape of the cross section of the cutout 49 depends on structural and budgeting considerations for a system 11, such as whether the support 19 will be used in a high pressure immersion cooling environment, for example.

In addition, FIG. 3 depicts a support 19 as including a plurality of cooling channels 23 that are separated by a central channel 35 located at an origin of a circular cross section of the support 19. As shown in FIG. 3, the cooling channel 23 is sized to accommodate a plurality of servers 13, which are positioned such that circuit boards (e.g., FIG. 5) of the servers 13 are immersed within a dielectric oil in the central channel 35. Each server 13 includes a server casing 53, which is a metal or plastic casing that serves to protect and enshroud a circuit board (e.g., FIG. 5) of the servers 13. Thus, as the dielectric oil flows through the central channel 35, the dielectric oil also flows through the server casing 53, and thus through a server 13 itself. As further shown in FIG. 3, an upper portion of the server casing 53, which encases the connection face 31 of the server 13 depicted in FIG. 1, abuts against the upper deck 29 such that the position of the server 13 is maintained under the force of gravity.

The size of the central channel 35 is a function of the width of a server casing 53 that surrounds an individual server 13 (as measured in a horizontal direction), as well as a diameter of the cylindrical container 17. That is, due to the fact that the support 19 is disposed within the cylindrical container 17, the maximum depth (as measured in a direction orthogonal to the vertical direction) of the central channel 35, which determines the number of servers 13 that may be suspended within the dielectric oil, is bounded by the diameter of the cylindrical container 17. In this way, the size of the central channel 35, and more generally the size of the support 19, is a function of the diameter of the cylindrical container 17. Thus, the diameter of the cylindrical container 17 and the support 19 may vary according to the specific number of servers 13 to be cooled by the dielectric oil, as well as the volume of dielectric oil necessary to create a desired cooling effect of the servers 13. Moreover, the dimensions of the central channel 35 may be a function of, for example, the number of servers 13 and the Rack Unit of each server (e.g., 1U, 2U).

FIG. 3 further depicts that each of the cooling channels 23 contains a radiator 51. To this end, and as discussed above, a conduit 21 is connected, at one end, to a radiator 51 that is disposed within a cooling channel 23. Each radiator 51 includes an internal core formed as a series of tubes and fins that serve to elongate the fluid flow path of the water disposed in the conduits 21. Due to the radiator 51 being immersed in the dielectric oil (e.g., FIG. 5) during the immersion cooling process, the elongated fluid flow path for the water is immersed in the dielectric oil as well. In this way, the elongated fluid flow path of the water allows the water more time to absorb heat from the dielectric oil. This, in turn, increases the cooling rate of the system 11 as a whole, as the water in the conduits 21 will carry away more heat per pass through the support 19 when the water is routed through the radiator 51 than an embodiment in which the radiator 51 is not present.

Figure 4:
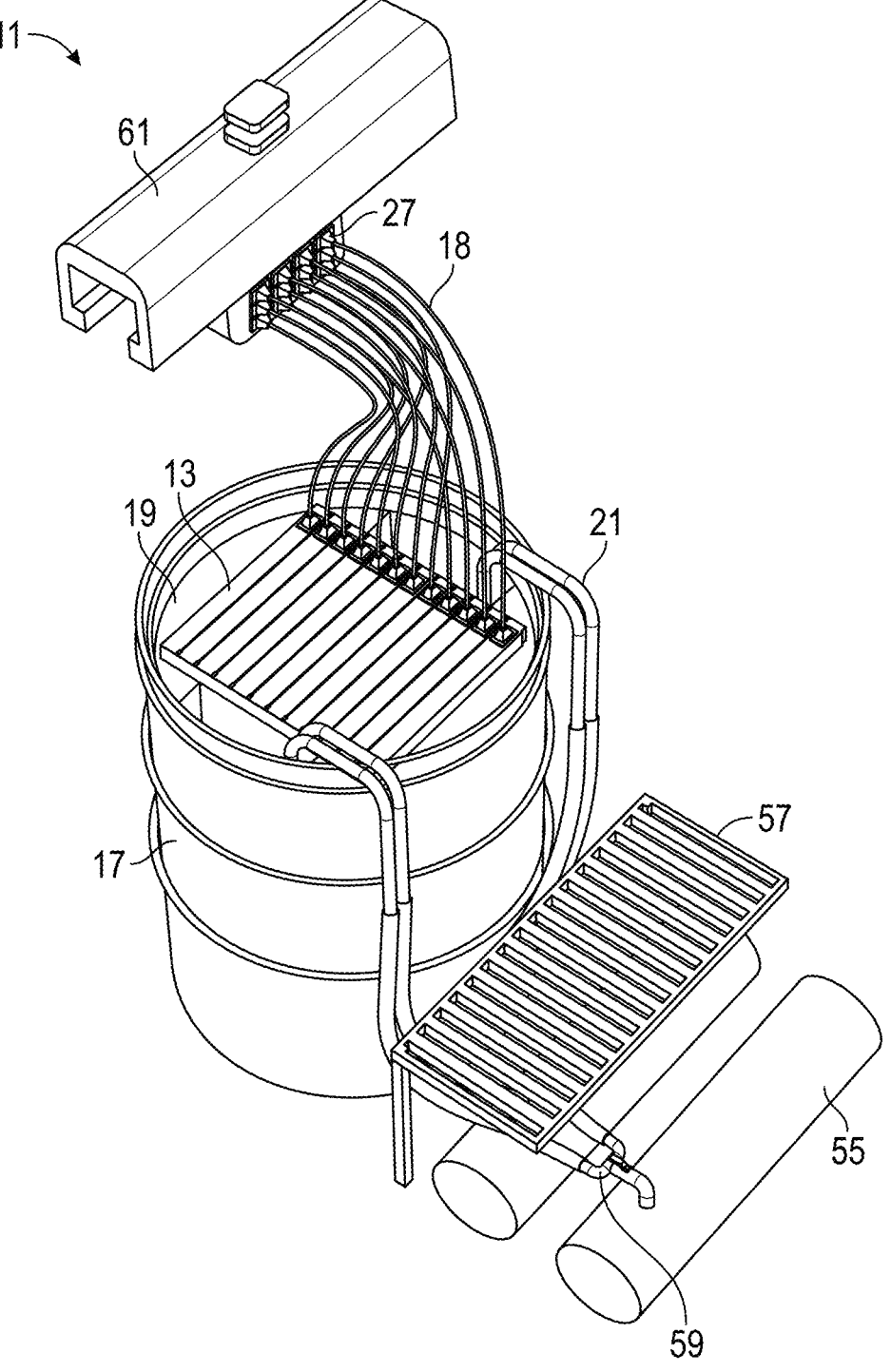
FIG. 4 depicts a system in accordance with one or more embodiments disclosed herein.

Turning to FIG. 4, FIG. 4 depicts a view of the system 11 that encompasses additional elements discussed above but not depicted in FIG. 1. For example, FIG. 4 depicts that a system 11 for providing a cooling immersion environment includes fluid pipe 55 and footpath 57. The fluid pipes 55 circulate water through the conduits 21 and the radiators 51, such that a first fluid pipe 55 delivers chilled water to the conduits 21 and a second fluid pipe 55 receives warmed water from the conduits 21 that has been heated by the dielectric oil. On the other hand, the footpath 57 provides a surface for an operator of the system 11 to walk above the fluid pipes 55. FIG. 4 further depicts that the system 11 includes a cylindrical container 17, a support 19, conduits 21, and a plurality of servers 13 disposed in the cylindrical container 17. The heat exchanger of the system 11 is thus formed by the conduits 21, the fluid pipes 55, and the radiators 51, and serves to remove heat from water contained in the system 11.

The plurality of servers 13 is powered by a power rail 61 that includes power terminals 27, which transfer power to the plurality of servers 13 by power cables 18 that are formed as wires with connecting ends. In relation to FIG. 1, the power rail 61 and the power terminals 27 replace the functionality of the power distribution system 15, such that the power rail 61 is configured to adapt input power to have a suitable phase, voltage, and current for powering the server 13, or otherwise to provide a suitable power without the adaptation thereof. The power terminals 27 are thus similar to the power terminal 27 of the server 13 depicted in FIG. 1, and are formed as dedicated transmission ports for transferring power from the power rail 61 to the plurality of servers 13.

The fluid pipes 55 are fluid pipes for transmitting chilled water to the conduits 21 or receiving warm water therefrom, such that the water is circulated through the system 11 in a closed loop fashion. To this end, the closed loop is formed by virtue of a conduit 21, the fluid pipes 55, and an in-line radiator 51 being formed as a connected structure without a fluid communication path for the water to intermix with the dielectric oil (e.g., FIG. 5). The inlet of each conduit 21 is attached, with a y-connector 59 or similar manifold, to a fluid pipe 55 that contains chilled water, and the outlet of the individual conduit 21 is similarly connected with a y-connector 59 to the fluid pipe 55 that contains warm water. In this way, chilled water is circulated from the first fluid pipe 55, through the conduits 21 and the radiators 51 to absorb heat from the dielectric oil (FIG. 5), and into the second fluid pipe 55 as warm water. The first fluid pipe 55 containing chilled water may further include a pump, disposed upstream of the fluid pipe 55 and not depicted in FIG. 5, which serves to pressurize and actuate the water in the conduits 21 and the fluid pipe 55. Alternatively, an in-line pump (not shown) may be formed in continuation or as part of a conduit 21, to further reduce the complexity of the system 11 and the assembly thereof.

FIG. 5 depicts a front view of a system 11 including a server 13, a cylindrical container 17, a support 19, and conduits 21. The support 19 abuts against a bottom surface 63 and a sidewall 65 of the cylindrical container 17, and is retained within the cylindrical container 17 under the force of gravity. The cylindrical container 17 retains, with the bottom surface 63 and the sidewall 65, a volume of a dielectric oil 67 such that the support 19 is depicted as being partially immersed in the dielectric oil 67. In other embodiments, the support 19 may be fully immersed in the dielectric oil 67. The portion of the support 19 submersed in the dielectric oil 67 is a function of the above mentioned system 11 characteristics of a heat transfer rate of the system, the size of the cylindrical container 17, and budgeting and/or material constraints, for example.

The support 19 itself is formed with a central channel 35 and two cooling channels 23, where the central channel 35 houses a circuit board 69 of a server 13 and is formed having a width substantially corresponding thereto. Components of the circuit board 69 are powered by a connection face 31 of the server 13 as discussed in relation to FIG. 1, where a power terminal 27 of the connection face 31 receives power from a power distribution system 15 or power rail 61 by way of a power cable 18. Similarly, data transmission to and from the server 13 is facilitated by a networking port 28 of the connection face 31 that receives a data cable 25 connected to a network switch 16, as discussed above. A pair of server handles 33 are fixed to the connection face 31 of the server 13 to allow for the removal thereof, and the connection face 31 abuts against an upper deck 29 of the support 19.

The circuit board 69 itself includes heat generating components such as processing units (including Central Processing Units (CPUs) and Graphics Processing Units (GPUs)), resistors, microprocessors, storage mediums (i.e., a Random Access Memory (RAM), a Hard Disk Drive (HDD), a Solid State Drive (SSD), etc.), and capacitors, by way of non-limiting example. The circuit board 69 may further include electrically connective pathways such as printed circuits, buses, ports (such as Peripheral Component Interconnect (PCI) connectors or similar ports), transmitters, receivers, and similar computing components to interconnect various components of the server 13.

To facilitate a removal of the heat produced by the heat generating components of the server 13, the circuit board 69 of the server 13 further includes a series of micropumps 71 disposed at the lowermost portion of the circuit board 69. Each micropump 71 comprises an impeller housed in a casing with a small form factor, and is powered by available power pins (not shown) on the circuit board 69, which receive their power from the power cable 18 and the power terminal 27. Alternatively, the micropumps 71 may be replaced with fans, propellers, or other fluid agitation devices that may be powered by and disposed on the circuit board 69. While the server 13 is powered and operating, the micropumps 71 induce motion in the dielectric oil 67 such that the dielectric oil 67 is circulated within the cylindrical container 17 and the support 19. The motion of the dielectric oil 67 is depicted in FIG. 5 as a fluid flow path 73, which is shown as a series of arrows denoting the direction of the fluid flow of the dielectric oil 67. Although not shown in FIGS. 5 and 6, the fluid flow path 73 may be routed through the interior of a server casing 53 of the server 13, where the server casing 53 may be a sealed chassis with upper and lower orifices that allow the dielectric oil 67 to pass therethrough. Thus, the server casing 53 ensures that the dielectric oil 67 flows through a server 13 by creating an enclosed structure for the fluid flow to pass through.

Thus, and as shown in FIG. 5, the dielectric oil 67 initially is agitated by the micropumps 71 at the lowermost portion of the circuit board 69. More specifically, the micropumps 71 draw in the dielectric oil 67 from beneath the circuit board 69, and expel the dielectric oil 67 in a vertically upward direction such that the dielectric oil 67 flows over components of the circuit board 69. Although not depicted in FIG. 5, the circuit board 69 is surrounded by a server casing 53 as depicted in FIG. 3, and the micropumps 71 are positioned to direct the fluid into and/or through the server casing 53. This causes the dielectric oil 67 to flow through the server 13 and over the heat generating components of the circuit board 69, and the dielectric oil 67 absorbs heat from the circuit board 69 as it flows thereover. After flowing over the circuit board 69, the dielectric oil 67 egresses from the server casing 53 of the server 13 out of connection face orifices 75, which are holes in the connection face 31 of the server 13 to allow for fluid communication through the server casing 53. From the orifices 75, the dielectric oil 67 flows over the upper deck 29 and into the cooling channels 23 of the support 19. Any dielectric oil 67 not immediately able to flow into the cooling channel 23 pools above the upper deck 29, and the lip 41 of the support 19 creates an abutment surface for the excess dielectric oil 67 until the excess dielectric oil 67 enters the cooling channel 23.

As discussed above in relation to FIGS. 1-4, each cooling channel 23 partially contains a conduit 21, such that the conduit 21 extends into and out of the cooling channel 23 below the upper deck 29 in order to connect to a radiator 51. The length to which the conduit 21 extends in the cooling channel 23 is a function of multiple factors, such as if the size of the radiator 51, a desired cooling effect to be produced by the system 11, and the size of the server 13, for example. As also discussed above, the conduit 21 contains a second cooling fluid (not shown), such as water, that is circulated through the radiator 51. The water thus absorbs heat from the dielectric oil 67, and is transferred by the conduit 21 and the fluid pipe 55 depicted in FIG. 4 out of the system 11 entirely. Once the dielectric oil 67 has finished flowing through the radiator 51 and out of the conduit 21, the dielectric oil 67 passes through the channel orifices 47 that connect the cooling channel 23 to the central channel 35. Thus, the dielectric oil 67 is returned to the central channel 35 without intermixing with the second cooling fluid, at which point the dielectric oil 67 may be recirculated by the micropumps 71. As a whole, the system 11 is configured with two, dedicated closed loop cooling fluid circuits that cycle fluid such that the system 11 forms a closed loop immersion cooling environment for removing heat produced by a server 13.

Figure 6:
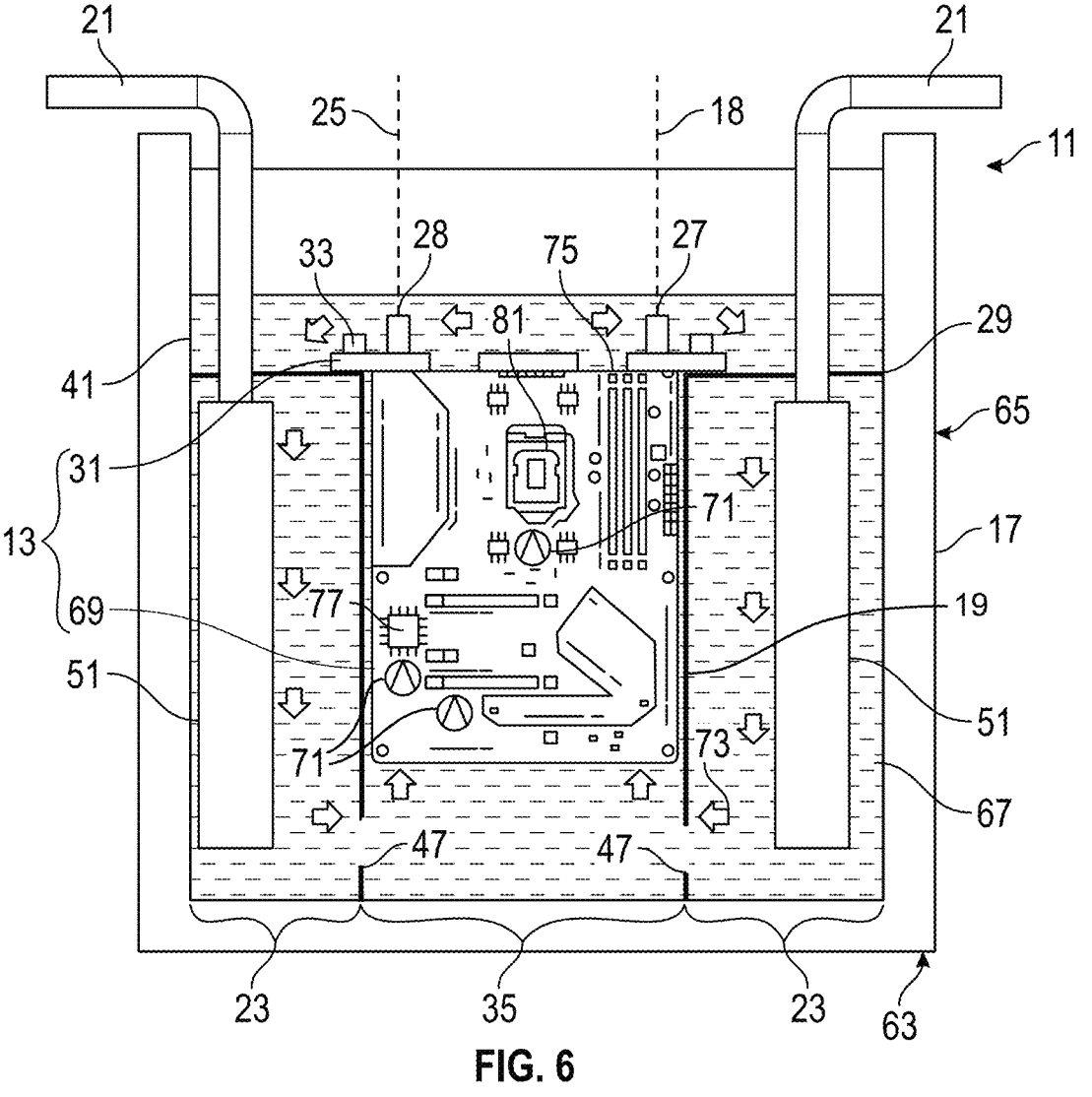
FIG. 6 depicts a support in accordance with one or more embodiments disclosed herein.

Turning to FIG. 6, FIG. 6 depicts an embodiment of a system 11 in which the micropumps 71 are not disposed at the lowermost portion of the circuit board 69 of the server 13. Rather, FIG. 6 depicts an embodiment in which the micropumps 71 are positioned on the circuit board 69 below specific components that generate a relatively high heat compared to the remainder of the components of the circuit board 69. That is, the specified components are characterized to output a higher heat load than a heat load threshold, for example, as determined by a manufacturer or user of the system 11. The heat load threshold may also be predetermined or calculated by, for example, determining when throttling may occur at a particular heat level. For example, typical operation of a CPU may range between 40 degrees Celsius and 80 degrees Celsius, whereas temperatures in excess of 80 degrees Celsius may incur damage to the CPU and thus, the CPU may be throttled to prevent damage.

In this embodiment, the specific components comprise integrated storage 77, PCI slots 79, and a Central Processing Unit (CPU) socket 81, which are components (or contain, house, or otherwise retain components) that produce a heat load above the predetermined heat threshold. The integrated storage 77 forms a storage device for the server 13, and comprises, for example, an SSD. The CPU socket 81 houses a CPU, which executes computer readable instructions for the server 13 and forms a dedicated processing device. On the other hand, the PCI slots 79 serve to connect to and retain, for example, one or more GPU devices of the server 13 such that the PCI slots 79 allow various other components with a PCI connector to be electrically connected to and formed with the server 13. The PCI slots 79 may also be configured with any other applicable expansion card, such as networking cards and sound cards, and may be a standard PCI slot or a PCI Express (PCI-e) slot, for example. While certain components (e.g., the CPU) are referred to in the singular to simplify discussion of the cooling system, those skilled in the art will appreciate that advanced server designs may accommodate a multitude of any of the above-described individual components.

The micropumps 71 are depicted as being disposed immediately below the integrated storage 77, the PCI slots 79, and the CPU socket 81 such that there are no intermediary components disposed between the micropumps 71 and the specified heat generating components. The positioning of the micropumps 71 adjacent to the specified components causes the fluid flow of the dielectric oil 67 to have its highest volumetric flow rate while passing over the specified component. In turn, this increases the amount of heat removed from the specified component, as the convection effect produced by the high-velocity flow of the dielectric oil 67 is greater than that of a low-velocity flow of the dielectric oil 67.

Furthermore, FIG. 6 depicts an increase in the number of micropumps disposed on a circuit board 69 compared to FIG. 5. Such illustrates that the total number of micropumps 71, or a cardinality of the plurality of the micropumps 71, is configured based upon a heat characteristic of the server 13, or a heat characteristic of a plurality of the servers 13. In this regard, the predetermined heat characteristic may be a maximum thermal output of a plurality of servers 13, a predetermined heat load to be removed from the plurality of servers 13 as a whole, or a specific heat load to be removed from each server 13 of the plurality of servers 13. A predetermined heat characteristic may further encompass other constraints, such as a maximum cooling effect of a particular dielectric oil 67 or second cooling fluid, or the thermal efficiency of the heat transfer processes used by the system 11. Thus, the predetermined heat characteristic is described herein, in a non-limiting fashion, as encompassing any individual or series of thermal properties, economic properties, structural properties, and/or similar considerations that guide the configuration and/or design of the system 11 and components thereof.

In addition, the configuration of the micropumps 71 may further be constrained by the relatively small clearance between the servers 13 and the central channel 35. More specifically, additional micropumps 71 may be necessary to increase the fluid flow velocity of the dielectric oil 67 in the event that small micropumps 71 must be used due to the tight clearance. That is, and by way of nonlimiting example, if a single micropump 71 has dimensions constrained by the clearance, and the constrained dimensions require that a single micropump 71 could not create a sufficient fluid flow velocity for cooling purposes, additional micropumps 71 may be used to create a "chain" of micropumps 71 that draws the dielectric oil 67 through the server 13. Alternatively, a micropump 71 may include intake and/or outtake pipes that serve to route the dielectric oil 67 from the bottom of the server 13, to a specific heat generating electronic component of the server 13, and away therefrom. In such cases, the intake and/or the outtake pipes may be sealed with the upper and lower surfaces of the server casing 53 to create dedicated dielectric oil 67 flow paths.

Figure 7:
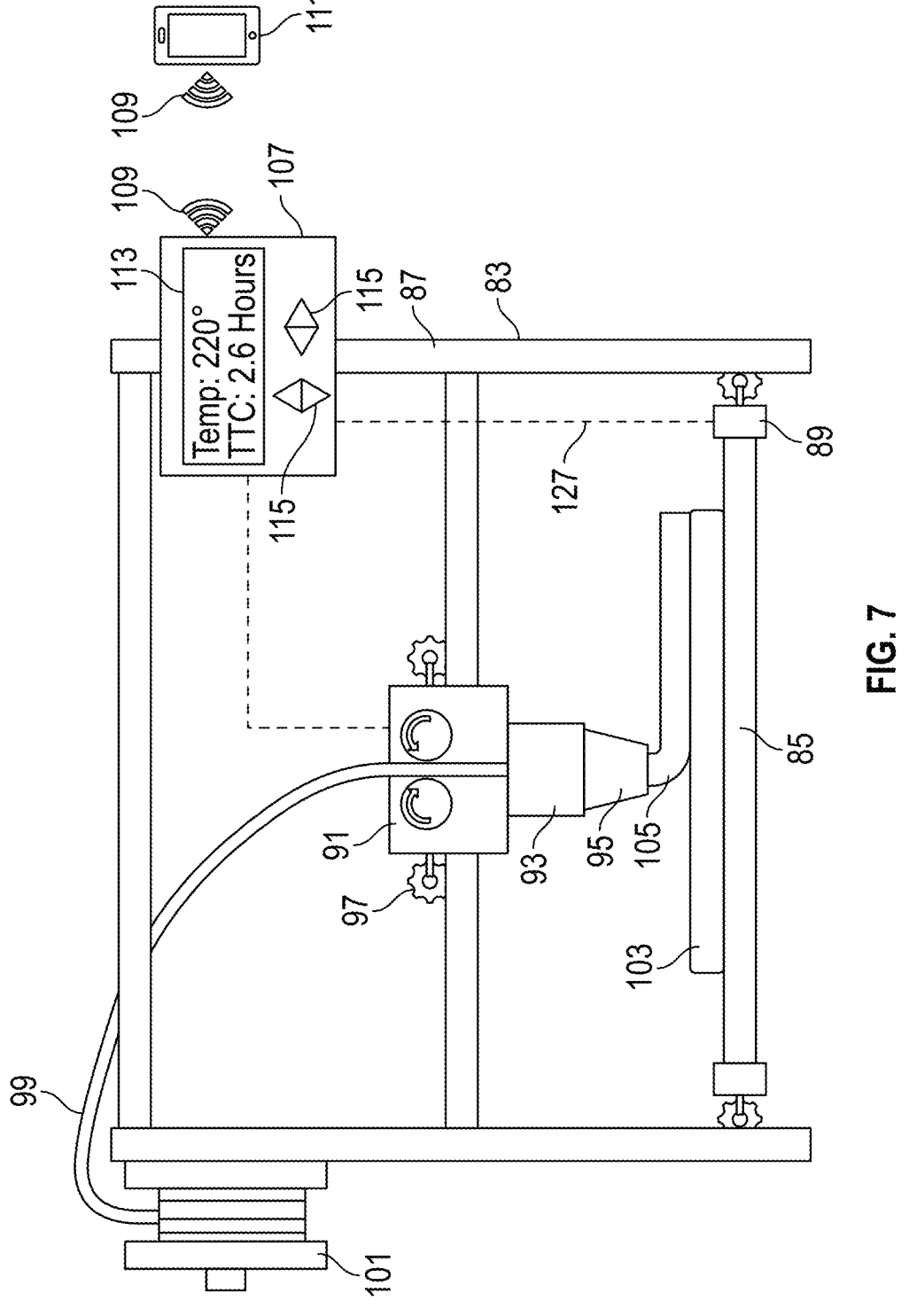
FIG. 7 depicts a 3D printer in accordance with one or more embodiments disclosed herein.

FIG. 7 depicts a 3D printer 83 configured to manufacture a support 19 consistent with one or more embodiments of the invention as described herein. As is commonly known in the art, example 3D printing processes include, but are not limited to, stereolithography, additive manufacturing, multi-jet fusion, fused deposition modeling, various sintering processes, and other forms of 3D printing not described herein for the sake of brevity. Thus, FIG. 7 presents one sample way of manufacturing a support 19 in a fused deposition modeling process, however it will be appreciated that multiple other methods of forming the support 19 may be substituted without departing from the nature of this specification.

As shown in FIG. 7, the 3D printer 83 includes a moveable substrate 85 that translates in a vertical direction along a printer frame 87 by way of a vertical conveyance mechanism 89 fixed to the substrate 85. The printer frame 87 is formed as a rack, for example, and a vertical conveyance mechanism 89 is a pinion actuated by a motor such that the printer frame 87 and the vertical conveyance mechanism 89 collectively form a rack and pinion arrangement. The substrate 85 itself is formed as a solid planar surface such as glass or metal, for example.

The 3D printer 83 further includes an extrusion motor 91, a heating body 93, an extrusion nozzle 95, a lateral conveyance mechanism 97, and filament 99 rolled on a filament roller 101 formed as a spool that is fixed to the printer frame 87. The filament 99 comprises a thread formed of a material such as carbon fiber, Polyactic Acid (PLA), or Acrylonitrile Butadiene Styrene (ABS), for example. Collectively, the extrusion motor 91, the heating body 93, and the extrusion nozzle 95 serve to heat the filament 99 from a solid to a liquid or semi-liquid state, and deposit the filament 99 onto the substrate 85. In this regard, the extrusion motor 91 comprises internal, motor driven sheaves that apply friction forces to the filament 99 to pull the filament 99 into the heating body 93. The heating body 93 is a closed loop heating element, referred to as a hotend, with a heated channel that the filament 99 extends through. As the filament 99 is forced into the heating body 93 by the extrusion motor 91, the heating body 93 warms the filament 99, causing the filament 99 to liquify or semi-liquify. The filament 99 is then translated across the surface of the substrate 85 by actuating the lateral conveyance mechanism 97 fixed to the extrusion nozzle 95. The filament 99 is subsequently deposited onto the substrate 85 in successive, vertically stacked layers, depicted as a first printed layer 103 and a second printed layer 105, to form the support 19 described previously.

The actions of the 3D printer 83 are facilitated by a controller 107 fixed to the printer frame 87 of the 3D printer 83. The controller 107 includes internal components and circuitry, such as a processor and a non-transient storage medium (e.g., FIG. 8), that serve to execute instructions to form the support 19. To this end, the instructions comprise a computer readable file storing code interpreted by the controller 107 to guide the movements of the vertical conveyance mechanism 89 and the lateral conveyance mechanism 97. The computer readable file may have a file type such as, but not limited to, an OBJect (OBJ) file type or a STereoLithography (STL) file type, which may be formed using Computer Aided Drafting (CAD)/Computer Aided Manufacturing (CAM) software, for example. Furthermore, the computer readable file may be transmitted to the controller 107 by a wireless data connection 109, such as a Wi-Fi connection, an internet connection, or a Bluetooth connection, formed with a computing device 111 such as a smartphone, tablet, or other computing device.

Various information concerning the 3D printing process is communicated to a user of the 3D printer 83 by way of a display 113 of the controller 107. The various information includes, for example, data such as the temperature of the filament 99 and the Time To Completion (TTC) of the printing process. The display 113 includes an Organic Light Emitting Diode (OLED) or Liquid Crystal Display (LCD) interface, and presents the various information described above to the user. Similarly, the user may interact with the 3D printer 83 by way of buttons 115 of the controller 107, which instruct the controller 107 to operate the vertical conveyance mechanism 89 and/or the lateral conveyance mechanism 97 according to the corresponding button 115 pressed by the user. More specifically, the controller 107 relays instructions to the vertical conveyance mechanism 89 and the lateral conveyance mechanism 97 by way of a wired data connection 127, such as a data cable, that transmits the instructions as electrical signals interpreted by the vertical conveyance mechanism 89 and the lateral conveyance mechanism 97.

Once the 3D printer 83 is depositing the filament 99 to form the support 19, the support 19 may include artifacts as a result of small errors in the printing process. For example, if the filament 99 does not cool or heat up at a sufficient rate or to a required temperature, the support 19 may be formed with gaps created by the over- or under-extrusion of the filament 99. To remove or prevent the formation of the artifacts, the 3D printing process may further include using a heated substrate 85 or by heating the environment of the 3D printer 83. Similarly, the substrate 85 may be formed with an adhesive layer, or the support 19 may be sanded after its formation. Thus, the 3D printing process may be completed with post-processing operations to address potential manufacturing defects of the support 19.

Figure 8:
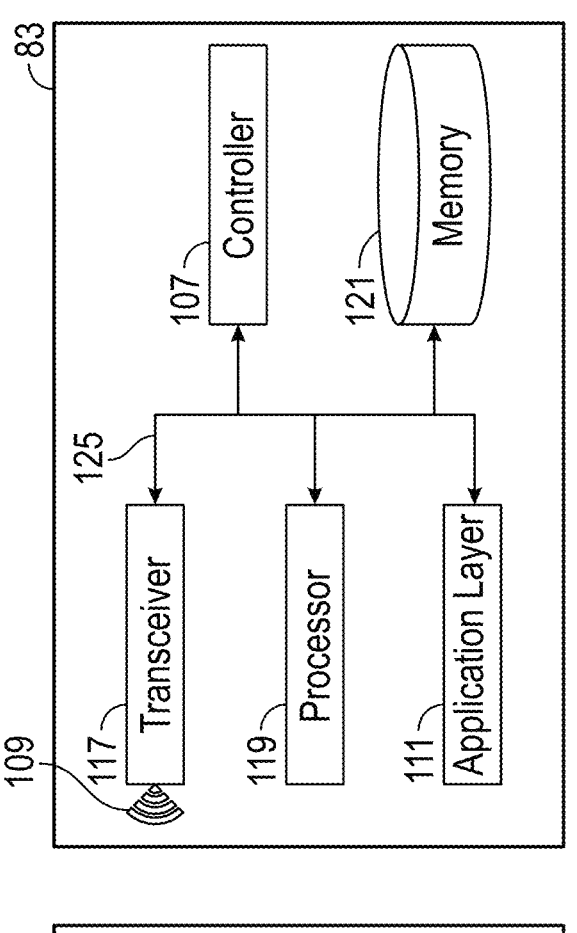
FIG. 8 depicts a computing device and a 3D printer in accordance with one or more embodiments disclosed herein.

Turning to FIG. 8, FIG. 8 presents a detailed overview of the physical hardware used in a 3D printer 83 and a computing device 111, where the computing device 111 represents a smartphone, a tablet, a server, a laptop, a desktop computer, or similar computing devices and systems described herein. As shown in FIG. 8, the 3D printer 83 and the computing device 111 are connected by a wireless data connection 109 formed with transceivers 117. More specifically, each of the transceivers 117 belonging to the computing device 111 and the 3D printer 83 includes components such as photodiodes and photoreceptors, or oscillatory transmission and reception coils that transmit data signals therebetween. The data signals may, for example, be transmitted according to wireless signal transmission protocols, such that the transceivers 117 transmit Wi-Fi, Bluetooth, cellular, or other signals of various forms as described herein. In this way, the transceivers 117 form a wireless data connection 109 that allows for the various data described herein, such as the computer readable file including instruction to form a support 19 with a 3D printer 83, to be transmitted between the computing device 111 and the 3D printer 83. In an alternative embodiment, the wireless data connection 109 may be replaced with a physical data connection, such as an ethernet cable or Universal Serial Bus (USB) cable to facilitate a faster data connection.

In addition to a transceiver 117, each of the 3D printer 83 and the computing device 111 include a processor 119. The processor 119 may be formed as a series of microprocessors, an integrated circuit, or associated computing devices that serve to execute computer readable instructions, or code, presented thereto. Similarly, each of the 3D printer 83 and the computing device 111 include a memory 121. The memory 121 is formed as a storage medium such as flash memory, Random Access Memory (RAM), a Hard Disk Drive (HDD), a solid state drive (SSD), a combination thereof, or equivalent devices. Each of the memories 121 store an operating system of its respective device, and well as computer instructions for performing any operations with the associated device. As one example, computer readable code forming an application for translating the computer readable file into a series of movements to 3D print a support 19 may be stored on the memory 121 of the 3D printer 83. As a second example, the memory 121 of the computing device 111 stores computer readable code to receive input from a user, such as a 3D modelling software used to form a representative model of the support 19, for example.

The computing device 111 further includes an interface 123, such as a touchscreen disposed on an OLED or LCD display panel, that allows the user of the computing device 111 to interact therewith. Alternatively, in a desktop computing environment, the interface 123 of the computing device 111 may be embodied as a computer mouse, a monitor, a keyboard, and similar devices that present and/or capture data from the user thereof. On the other hand, the 3D printer 83 receives user input by way of the controller 107, which hosts software and/or applications for interpreting the computer readable file including the model of the support 19 as discussed above. In particular, the controller 107 includes buttons 115 and a display 113 that allow the user to interact with and receive data concerning the process of 3D printing the support 19 with a 3D printer 83.

Applications utilized by the user, the computing device 111, or the 3D printer 83 as described herein are formed as a software layer depicted in FIG. 8 as an application layer 129 included in each of the 3D printer 83 and the computing device 111. Thus, the application layer 129 comprises computer readable code, written in programming languages such as C++, Python, Java, Visual Basic, and/or other languages that form applications presented to and interacted with by the user, the computing device 111, and/or the 3D printer 83. Examples of applications as described herein include software used to model the support 19 and computer code for translating the model of the support 19 into actuation instructions for the vertical conveyance mechanism 89 and the lateral conveyance mechanism 97, for example. The application layer 129 is stored on the memory 121 or a similar storage device, such that each of the computing device 111 and the 3D printer 83 include a separate application layer 129.

To allow for data transmission between the various components of the 3D printer 83 and the computing device 111, each of the 3D printer and the computing device 111 further include a data bus 118. The data bus 118 is formed as one or more wires, wire terminals, printed circuits, or other electrically connective pathways that allow electric signals to be transmitted between the various components of the 3D printer 83 and the computing device 111. That is, the data bus 118 provides physical connections between each of the transceiver 117, the processor 119, and the memory 121 for data transmission and reception purposes. Thus, the data bus 118 serves to assemble the individual components of the computing device 111 and the 3D printer 83, such as the processor 119, the memory 121, and the transceiver 117, into a functional device.

Turning to FIG. 9, FIG. 9 depicts a method 900 for using a support 19 for directing a fluid flow path 73 of a dielectric oil 67 consistent with one or more embodiments described herein. Steps of FIG. 9 may be performed by a system 11 as described herein, but are not limited thereto. Furthermore, the steps of FIG. 9 may be performed in any order, such that the steps are not limited to the sequence presented. In addition, multiple steps of FIG. 9 may be performed as a single action, or one step may comprise multiple actions by devices or components described herein.

The method 900 initiates with step 910, which includes abutting a connection face 31 of a server 13 against an upper deck 29 of the support 19 that extends in a longitudinal plane. The support 19 may be a 3D printed structure that includes various channels, further described below, that serve to direct a fluid flow of the dielectric oil 67 through the support 19 and the server 13. The dielectric oil 67 and the support 19 are disposed in a cylindrical container 17, such that the support 19 is at least partially immersed in the volume of the dielectric oil 67. As the dielectric oil 67 flows through the server 13, the dielectric oil 67 absorbs heat from components of the server 13, and moves the heat to a different location of the support 19 to be removed from the system 11 entirely. Initially, in step 910, the server 13 is inserted into the support 19 until a connection face 31 abuts against the upper deck 29 of the support 19, where the connection face 31 is larger than a central channel 35 of the support 19 configured to receive the remainder of the server 13.

In step 920, the central channel 35 of the support 19 at least partially contains the server 13, where the central channel 35 is formed as a first opening of the upper deck 29 that extends in a direction orthogonal to the longitudinal plane, or more generally the upper deck 29. As the connection face 31 is formed and fixed to the uppermost portion of the server 13, the remaining portion of the server 13, or more specifically the circuit board 69 of the server 13, is disposed in the central channel 35 when the connection face 31 abuts against the upper deck 29 of the support 19. Thus, steps 910 and 920 may be performed as a single action of inserting a server 13 in a support 19, where the circuit board 69 of the server 13 is inserted in the central channel 35 until the connection face 31 of the server 13 abuts against the upper deck 29 of the support 19. In this orientation, the circuit board 69 of the server 13 is submerged in the dielectric oil 67 within the central channel 35, such that the system 11 as a whole forms an immersed cooling environment for the server 13. The central channel 35 itself may be shaped to house multiple servers 13, arranged in a depth direction of the support 19, such that the support 19 houses a plurality of servers 13 overall. Thus, steps 910 and 920 may be repeated for each server 13 of the plurality of servers 13, until a predetermined or required number of server 13 are disposed in the central channel 35, or until the central channel 35 cannot contain additional servers 13. Once the servers 13 are situated within the central channel 35, the method 900 proceeds to step 930.

In step 930, a conduit 21 and a radiator 51 of a heat exchanger comprising a fluid pipe 55 is housed in cooling channels 23 of the support 19. Similar to the central channel 35, the cooling channel 23 is formed as a second opening of the upper deck 29 that extends in the direction orthogonal to the longitudinal plane, or more generally the upper deck 29 itself. The conduit 21 connects from a fluid pipe 55 containing chilled water to a radiator 51 within the cooling channel 23 such that the chilled water is circulated through the support 19 with the conduit 21 and the radiator 51. The conduit 21 further connects from the radiator 51 to a second fluid pipe 55, which carries water out of the system 11, such that the radiator 51 is disposed in line with the conduit 21. Thus, as the water is circulated through the conduit 21, the water absorbs heat from the dielectric oil 67 disposed in the cooling channels 23, and transfers the heat out of the system 11 by one of the fluid pipes 55. The support 19 is formed with at least two cooling channels 23, disposed on either side of the central channel 35, such that the servers 13 are bordered by conduits 21 and radiators 51 positioned in the cooling channels 23.

In step 940, the fluid flow path 73 of dielectric oil 67 is directed from the central channel 35 into the cooling channel 23 with a lip 41 of the support 19. The lip 41 extends vertically upwards from the upper deck 29 around a periphery thereof. Thus, after the dielectric oil 67 is circulated through the servers 13 (e.g., with micropumps 71 as described above) the dielectric oil 67 pools on the upper deck 29 in the space above the connection faces 31 of the servers 13. The pooled dielectric oil 67 abuts against the lip 41, and flows into the cooling channels 23 formed on either side of the support 19. In this way, the dielectric oil 67 is redirected into the cooling channels 23, which house the conduits 21 and radiators 51 as described above, such that the water in the conduits 21 and the radiators 51 absorbs heat from the dielectric oil 67 as the dielectric oil 67 flows past the conduits 21 and the radiators 51 in a vertical direction.

In step 950, the cooling channels 23 are fluidly connected to the central channel 35 by way of a channel orifice 47. The channel orifice 47 is formed as an opening extending from the cooling channels 23 to the central channel 35, and allows fluid communication therebetween. Thus, the dielectric oil 67 flows through the channel orifice 47 from the cooling channel 23 to the central channel 35, at which point the fluid flow path 73 of the dielectric oil 67 is situated below the micropumps 71. The micropumps 71 then proceed to re-agitate or induce motion in the dielectric oil 67 such that the dielectric oil 67 proceeds to reflow, in an iterative fashion, through a server casing 53 of the server 13. Thus, the method 900 completes with the recirculation of the dielectric oil 67 within the cylindrical container 17 in a closed loop fluid flow path 73 formed by the central channel 35, the upper deck 29, the cooling channels 23, and the channel orifice 47 of the support 19.

Although only a few example embodiments have been described in detail above, those skilled in the art will readily appreciate that many modifications are possible in the example embodiments without materially departing from this invention. For example, a support may be formed without a lip due to material cost savings, in which case the functions of the lip are performed by the sidewall of the cylindrical container. Furthermore, the distance between a series of servers and a bottom surface of a fluid container may vary while designing a system in accordance with the amount of fluid in the container, the desired cooling effect of the system, and similar considerations. In addition, many modifications will be appreciated by those skilled in the art to adapt a particular instrument, situation, or material to embodiments of the disclosure without departing from the essential scope thereof. Accordingly, all such modifications are intended to be included within the scope of this disclosure as defined in the following claims.

Unless otherwise indicated, all numbers expressing quantities used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by one or more embodiments described herein. At the very least, and not as an attempt to limit the application of the doctrine of equivalents to the scope of the claim, each numerical parameter should at least be construed in light of the number of reported significant digits and by applying ordinary rounding techniques.

Embodiments of the present disclosure may provide at least one of the following advantages: cost savings, material savings, and an increased amount of heat removed from a system including a server. Cost and material savings are received by forming the support as a simple structure that fits inside of widely available cylindrical containers (e.g., barrels), and are further received by forming the support with 3D manufacturing processes. Similarly, the amount of heat removed from the server is increased as a function of immersing the server in a dynamic fluid flow of a dielectric oil that transfers heat away from the server, and subsequently removing the heat from the dielectric oil with a second cooling liquid.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A support for directing a fluid flow of a dielectric oil through a server, the support comprising:

an upper deck configured to provide an abutment surface for a connection face of the server, where the upper deck extends in a longitudinal plane;

a central channel, formed as a first opening of the upper deck that extends in a direction orthogonal to the longitudinal plane, configured to at least partially contain the server;

a cooling channel, formed as a second opening of the upper deck that extends in the direction orthogonal to the longitudinal plane, configured to house a conduit and a radiator of a heat exchanger;

a lip, protruding from the upper deck in the direction orthogonal to the longitudinal plane, configured to direct the fluid flow of the dielectric oil from the central channel into the cooling channel; and a channel orifice configured to fluidly connect the cooling channel to the central channel such that the dielectric oil is transferred from the cooling channel into the central channel through the channel orifice, wherein the cooling channel comprises:

a guiding protrusion configured to maintain a position of the radiator and the conduit within the support, and an indentation that adapts a rounded portion of the cooling channel to a flat face.

2. The support of claim 1, further comprising: one or more micropumps, integrated with the server, that are configured to circulate the dielectric oil through the central channel in a vertical direction orthogonal to the longitudinal plane.

3. The support of claim 1, wherein the conduit is connected, at a first end thereof, to a fluid pipe of the heat exchanger that is configured to house a volume of water, and connected, at a second end thereof, to the radiator disposed in the cooling channel of the support.

4. The support of claim 1, wherein the support is formed with a substantially cylindrical profile configured with a first diameter that is smaller than a second diameter of a cylindrical container, and further configured with a first height, measured in the direction orthogonal to the longitudinal plane, that is smaller than a second height of the cylindrical container such that the support is configured with a profile sized to fit within the cylindrical container.

5. The support of claim 1, wherein the support is formed as a 3D printed structure by depositing a filament on a substrate in successive, vertically stacked layers with an extrusion nozzle of a 3D printer controlled by a computing device.

6. The support of claim 1, wherein the central channel of the support is further configured to at least partially contain a plurality of servers.

7. The support of claim 6, wherein each server of the plurality of servers comprises one or more micropumps of a plurality of micropumps configured to circulate the dielectric oil within the central channel.

8. The support of claim 7, wherein a cardinality of the plurality of micropumps is configured based on a heat characteristic of the plurality of servers, where the heat characteristic comprises: a maximum thermal output of the plurality of servers, a predetermined heat load to be removed from the plurality of servers as a whole, or a specific heat load to be removed from each server of the plurality of servers.

9. The support of claim 2, wherein the one or more micropumps are positioned on the server at locations immediately below specified components of the server, where the specified components are characterized to output a higher heat load than a heat load threshold.

10. The support of claim 2, wherein the server comprises a casing configured to surround a circuit board of the server, and the one or more micropumps are integrated with the circuit board in an interior volume of the casing such that the dielectric oil flows through the casing of the server within the central channel of the support.

11. A method for using a support for directing a fluid flow of a dielectric oil through a server, the method comprising:

abutting a connection face of the server against an upper deck of the support that extends in a longitudinal plane;

at least partially containing the server in a central channel of the support, where the central channel is formed as a first opening of the upper deck that extends in a direction orthogonal to the longitudinal plane;

housing a conduit and a radiator of a heat exchanger in a cooling channel of the support, where the cooling channel is formed as a second opening of the upper deck that extends in the direction orthogonal to the longitudinal plane;

directing the fluid flow of the dielectric oil from the central channel into the cooling channel with a lip of the support, where the lip protrudes from the upper deck in the direction orthogonal to the longitudinal plane, and fluidly connecting the cooling channel to the central channel with a channel orifice such that the dielectric oil is transferred from the cooling channel to the central channel through the channel orifice, wherein the method further comprises maintaining a position of the radiator and the conduit within the support with a guiding protrusion of the cooling channel, and wherein the cooling channel further comprises an indentation configured to adapt a rounded portion of the cooling channel to a flat face.

12. The method of claim 11, further comprising: circulating the dielectric oil through the central channel, in a vertical direction orthogonal to the longitudinal plane, with one or more micropumps integrated with the server.

13. The method of claim 11, further comprising:

inserting the radiator into the cooling channel of the support;

connecting the conduit, at a first end thereof, to a fluid pipe of the heat exchanger that houses a volume of water; and connecting the conduit, at a second end thereof, to the radiator disposed in the cooling channel.

14. The method of claim 11, further comprising: at least partially containing a plurality of servers in the central channel of the support.

15. The method of claim 14, further comprising: circulating the dielectric oil within the central channel with a plurality of micropumps, where each server of the plurality of servers comprises one or more micropumps of the plurality of micropumps.

16. The method of claim 15, further comprising: configuring a cardinality of the plurality of micropumps based on a predetermined heat characteristic of the plurality of servers, where the predetermined heat characteristic comprises a maximum thermal output of the plurality of servers, a predetermined heat load to be removed from the plurality of servers as a whole, or a specific heat load to be removed from each server of the plurality of servers.

17. The method of claim 12, further comprising: positioning the one or more micropumps on the server at locations immediately below specified components of the server, where the specified components are predetermined to output a higher heat load than a predetermined heat load threshold.

18. The method of claim 12, further comprising: surrounding a circuit board of the server with a casing of the server, where the one or more micropumps are integrated with the circuit board in an interior volume of the casing such that the dielectric oil flows through the casing of the server within the central channel of the support.

19. A computer readable medium storing instructions, executed by a processor of a 3D printer, causing the 3D printer to form a support by:

depositing a filament on a substrate in successive, vertically stacked layers with an extrusion nozzle of the 3D printer to form the support such that the support comprises:

an upper deck configured to provide an abutment surface for a connection face of a server, where the upper deck extends in a longitudinal plane;

a central channel, formed as a first opening of the upper deck that extends in a direction orthogonal to the longitudinal plane, configured to at least partially contain the server;

a cooling channel, formed as a second opening of the upper deck that extends in the direction orthogonal to the longitudinal plane, configured to house a conduit and a radiator of a heat exchanger;

a lip, protruding from the upper deck in the direction orthogonal to the longitudinal plane, configured to direct a fluid flow of a dielectric oil from the central channel into the cooling channel; and a channel orifice configured to fluidly connect the cooling channel to the central channel such that the dielectric oil is transferred from the cooling channel into the central channel through the channel orifice, wherein the cooling channel comprises:

a guiding protrusion configured to maintain a position of the radiator and the conduit within the support, and an indentation that adapts a rounded portion of the cooling channel to a flat face.

* * * * *